US00RE34794E

United States Patent [19]

Farnworth

[11] E Patent Number: Re. 34,794

[45] Reissued Date of Patent: Nov. 22, 1994

[54] GULL-WING ZIG-ZAG INLINE LEAD PACKAGE HAVING END-OF-PACKAGE ANCHORING PINS

[75] Inventor: Warren M. Farnworth, Nampa, Id.

[73] Assignee: Micron Technology, Inc., Boise, Id.

[21] Appl. No.: 10,022

[22] Filed: Jan. 28, 1993

Related U.S. Patent Documents

Reissue of:

[64] Patent No.: 4,967,262
Issued: Oct. 30, 1990
Appl. No.: 432,598
Filed: Nov. 6, 1989

[51] Int. Cl.[5] ..... H01L 39/02; H01L 23/16; H01L 23/42; H01L 23/44

[52] U.S. Cl. ..... 257/678; 257/696; 257/701; 257/733; 361/748; 361/772; 361/783; 361/807

[58] Field of Search ..... 257/678, 696, 701, 733; 361/397, 400, 404, 417, 748, 783, 772, 807

[56] References Cited

U.S. PATENT DOCUMENTS

| | | | |
|---|---|---|---|
| 3,056,939 | 10/1962 | Rayburn | 339/17 |
| 3,162,721 | 12/1964 | Rayburn | 174/68.5 |
| 3,524,108 | 8/1970 | English | 317/101 |
| 3,796,921 | 3/1974 | Fischer | 317/99 |
| 4,155,615 | 5/1979 | Zimmerman, Jr. et al. | 339/14 L |
| 4,611,389 | 9/1986 | Blair et al. | 29/589 |
| 4,677,458 | 6/1987 | Morris | 357/74 |
| 4,698,660 | 10/1987 | Kubota et al. | 357/70 |
| 4,736,520 | 4/1988 | Morris | 29/827 |
| 4,967,262 | 10/1990 | Farnsworth | 257/678 |
| 4,975,763 | 12/1990 | Baudouin et al. | 257/701 |

*Primary Examiner*—Robert P. Limanek
*Assistant Examiner*—David Ostrowski
*Attorney, Agent, or Firm*—Angus C. Fox, III

[57] ABSTRACT

A semiconductor package having a gull-wing, zig-zag, inline-lead configuration and end-of-package anchoring devices for rigidly affixing the package to a circuit board such that each lead is in compressibe contact with its associated mounting pad on the board. The anchoring devices of a first embodiment comprise anchoring pins having fish-hook-type barbs which lock against the under side of the board when the pegs are inserted through holes in the board; a second embodiment utilizes anchoring pins which are adhesively bonded in recesses that have been drilled or molded into the board; a third embodiment utilizes anchoring pins, the ends of which can be bonded directly to planar peg-bonding regions on the surface of the board; and a fourth utilizes tapered anchoring ping which may be inserted with an interference fit into holes in the board. The invention eliminates the need for mechanical support of the packages during solder reflow operations used during board assembly and repair.

18 Claims, 6 Drawing Sheets

GULL-WING ZIG-ZAG INLINE LEAD PACKAGE HAVING END-OF-PACKAGE ANCHORING PINS

Matter enclosed in heavy brackets [ ] appears in the original patent but forms no part of this reissue specification; matter printed in italics indicates the additions made by reissue. *This application is a reissue of 07/432,598 filed Nov. 6, 1989 U.S. Pat. No. 4,967,262.*

FIELD OF THE INVENTION

This invention relates to semiconductor packaging techniques, and, more specifically, to high-density, surface-mount devices.

BACKGROUND OF THE INVENTION

Integrated semiconductor devices are typically constructed en masse on a wafer of silicon or gallium arsenide. Each device generally takes the form of an integrated circuit (IC) die. If the die is to be encapsulated in a plastic package, it is first bonded to the die-mounting paddle of a leadframe which is attached to other leadframes in a leadframe strip. The wire attachment pads on the die are connected with their corresponding leads on the leadframe with aluminum or gold wire during a wire bonding process, following which the die is coated with a protective polyimide film. Finally, the die is encapsulated in plastic and the plastic-encapsulated chip undergoes a trim and form operation which separates the interconnected packages on the leadframe strip into individual entities and bends (forms) the leads of each package. The package is then recognizable as an IC "chip". The operation for manufacturing plastic-encapsulated packages is highly automated, allowing high quality and low cost.

IC packages take many forms, although the trend is clearly toward designs which increase mounting density. For years, the standard IC package was the dual-inline package or DIP. Such packages were typically through-hole soldered on printed circuit boards. A newer dual-inline lead design, known as small-outline J-lead package, has been rapidly supplanting the standard DIP design for two reasons. Firstly, the leads of an SOJ package are soldered to only one side of a circuit board, thus leaving the other side of the board free for the mounting of additional SOJ packages. Secondly, the leads are much less vulnerable to damage prior to board assembly, hence, there are fewer rejects. Both DIP and SOJ packages are horizontal packages (i.e., the die is mounted in a plane parallel to the board-attachment plane). Vertical packages are also coming into greater use because they permit greater circuit board mounting density. Vertical packages have a very narrow horizontal cross section, with the die mounted between the vertical sides of the package, the distance between which is minimized. All leads exit through the lower edge of the package. The zig-zag inline package or ZIP is a typical vertical package. A vertical package known as the zig-zag inline package or ZIP is also coming into greater use. Existing ZIPs are designed for through-hole-soldered connections on a circuit board. Since such packages require very little board area for connection, they are particularly useful where high-density applications are a must. Although the use of a surface-mount ZIP has been suggested by Barbara Cole of Boise, Idaho's Micron Technology, Inc., the appeal of such a package is greatly diminished by the requirement that each package be maintained in a vertical position over its associated mounting pads until a solder reflow operation is performed.

What is needed is a new type of package which combines the density advantages of both the SOJ-type package with the vertical packaging of the ZIP, which can be positioned on a circuit board with currently available board-stuffing equipment and which will maintain its vertical position on the board without auxiliary package-support apparatuses until final attachment of the package to the circuit board during a solder reflow operation.

SUMMARY OF THE INVENTION

The present invention combines the density advantages of both the SOJ-type package and the ZIP in a package design which does not require auxiliary mechanical support prior to solder reflow. This has been accomplished by creating a package having gull-wing shaped leads in a zig-zag configuration. In addition, the package has an anchoring pin at each end which rigidly secures the package to a printed circuit board both before and after lead-to-board attachment via solder reflow. Several embodiments of the invention adapt themselves to various types of automatic board-stuffing equipment. The first embodiment utilizes anchoring pins having fish-hook-type barbs which lock against the under side of the circuit board when the positioning pins are inserted through holes in the board having roughly the same diameter as the pins. When the anchoring pins are seated in the board holes, each of the package's gull-wing-shaped leads is resiliently biased against its associated bonding pad on the board, thus assuring a solid electrical connection when the board and package assembly is solder reflowed. A first embodiment package is designed so that a similar package with anchoring pins having reverse-direction barbs can be mounted on the other side of the board using the same holes. A second embodiment of the invention utilizes anchoring pins which can be bonded using quick-setting adhesive to recesses that been drilled or molded into only one side of the circuit board. A third embodiment dispenses with holes and recesses in the board altogether and has anchoring pins, the ends of which can be bonded directly to planar pin bonding regions on a circuit board. The first and second embodiments have an advantage in that the anchoring pins afford a significant degree of protection to the gull-wing leads from mechanical damage. On the other hand, the third embodiment, while not providing the same degree of protection to the leads, does offer the advantage of not requiring a drilling step for creating mounting holes or mounting recesses on the circuit board.

PREFERRED EMBODIMENT OF THE INVENTION

Figure 1:
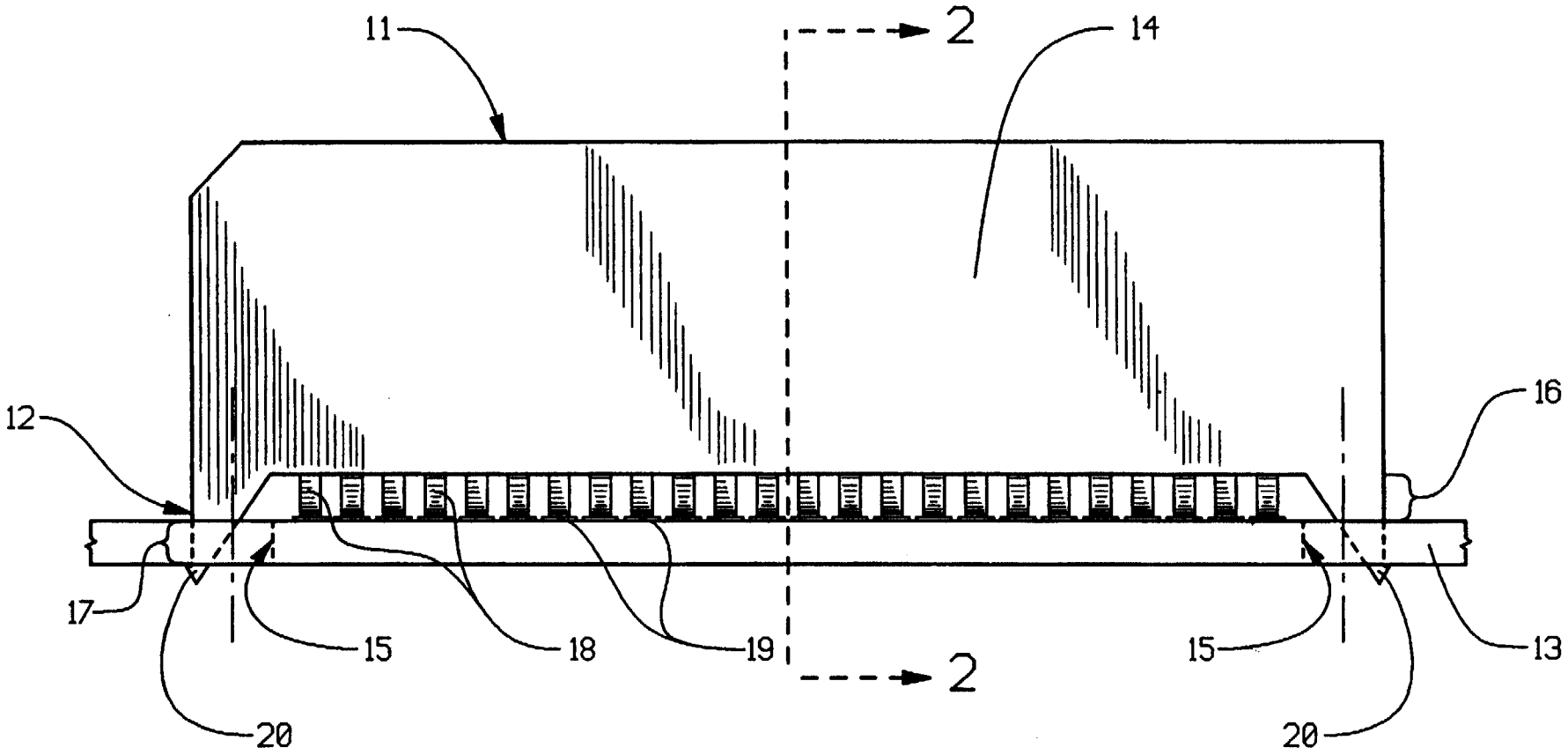
FIG. 1 is a longitudinal side elevational view of a first embodiment of the new gull-wing ZIP package having barbed anchoring pins mounted on a printed circuit board.

Referring now to FIG. 1, a first embodiment of the invention in the form of a gull-wing zig-zag inline package 11 having barbed anchoring pins 12 is shown mounted on a printed circuit board 13. Anchoring pins 12 are integral with the package's molded plastic body 14. A pair of round anchoring pin holes 15 have been drilled in circuit board 13. Anchoring pins 12 have a square-shouldered shank 16 that acts as a travel limiting device when pins 12 are inserted into holes 15. The lower portion 17 of positioning pins 12 is sized so that it may be inserted into holes 15. The gull-wing shaped leads 18 are resiliently biased against bonding pads 19 when anchoring pins 12 have been seated against their square shanks 16. Barbs 20 are shown as anchoring package 11 against the lower surface of printed circuit board 13. It will be noted that anchoring pins 12 extend below the level of gull-wing shaped leads 18, thus providing protection to the leads from mechanical damage.

Figure 2:
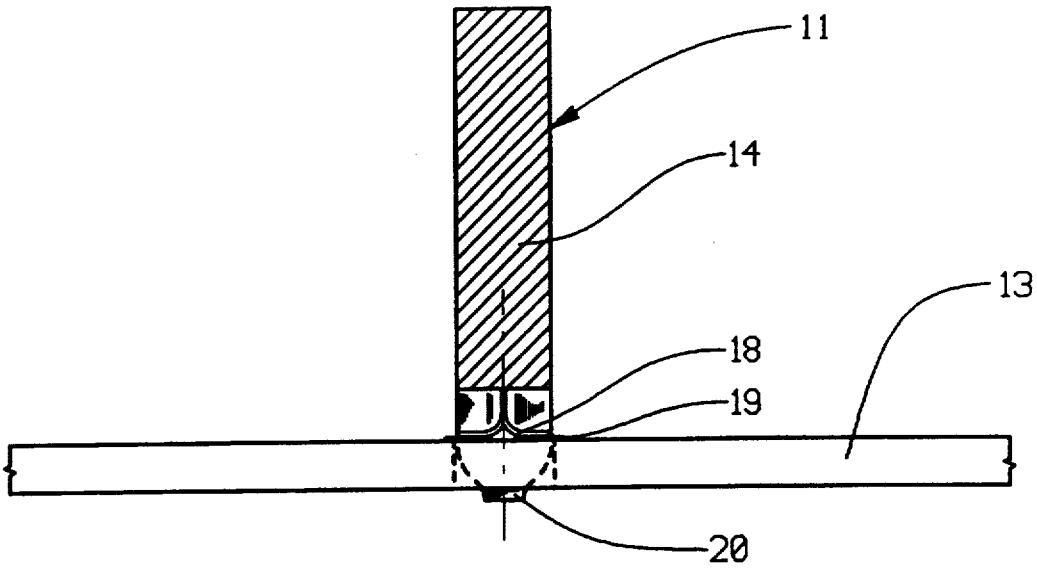
FIG. 2 is a cross-sectional view of the first embodiment through broken line 2—2 of FIG. 1.

Referring now to FIG. 2, which is a crosssectional view through the gull-wing zig-zag inline package 11 of FIG. 1, the gull-wing shape of leads 18 is readily discernable. Barb 20 is also readily visible in this view.

Figure 3:
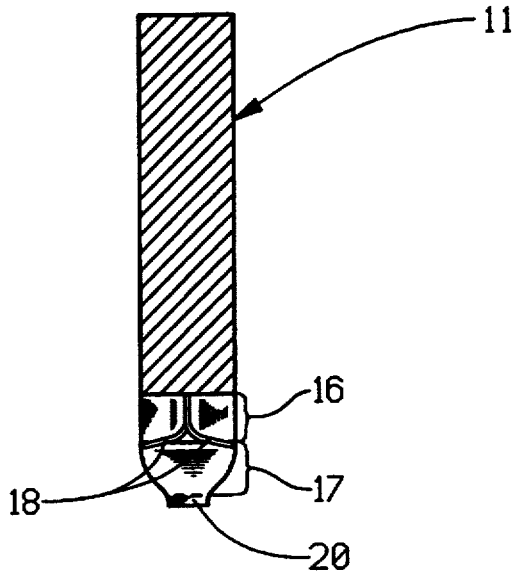
FIG. 3, is the same cross-sectional view as depicted in FIG. 2, with the exception that the package has been removed from the circuit board in order to show the gull-wing leads in an uncompressed state.

Referring now to FIG. 3, package 11 is shown detached from circuit board 13. The unanchoring of package 11 from circuit board 13 has been done so as to be able to see the shape of gull-wing leads 18 when they are not under compression against bonding pads 19.

Figure 4:
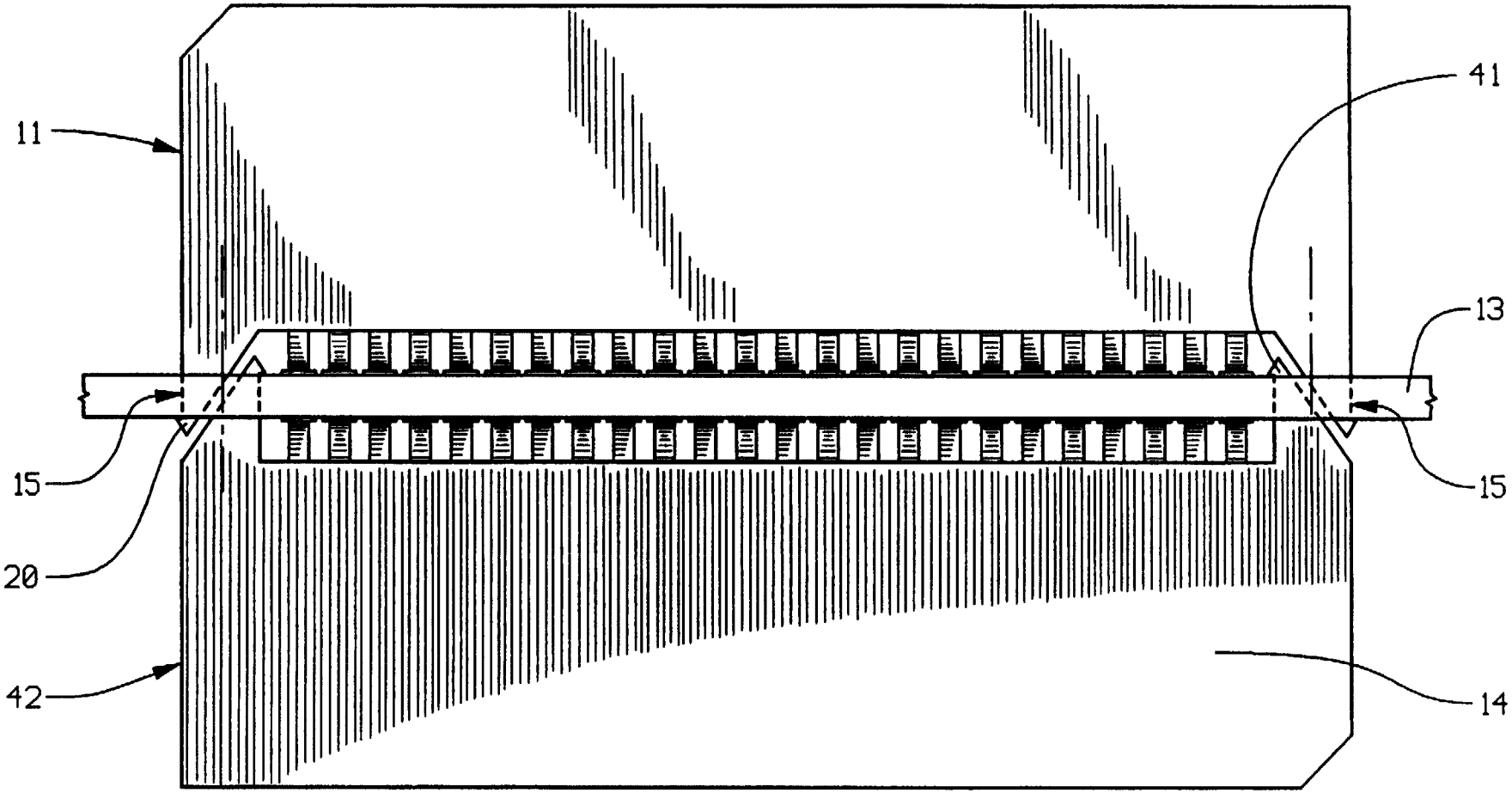
FIG. 4 is a longitudinal side elevational view of a pair of first embodiments of the new gull-wing ZIP package mounted within the same pair of holes on a printed circuit board, the upper package having barbed anchoring pins with outward-facing barbs and the lower package having anchoring pins with inwardfacing barbs.

Referring now to FIG. 4, a pair of first-embodiment devices are shown anchored to different sides of a printed circuit board 13 using a single pair of anchoring holes 15. It will be noted that the barbs 20 on the upper package 11 face outward, while the barbs 41 on lower package 42 face inward. Using the technique of opposite facing barbs in order to populate both sides of a printed circuit board, it is evident that two different molds are required for encapsulation when creating the package.

Figure 5:
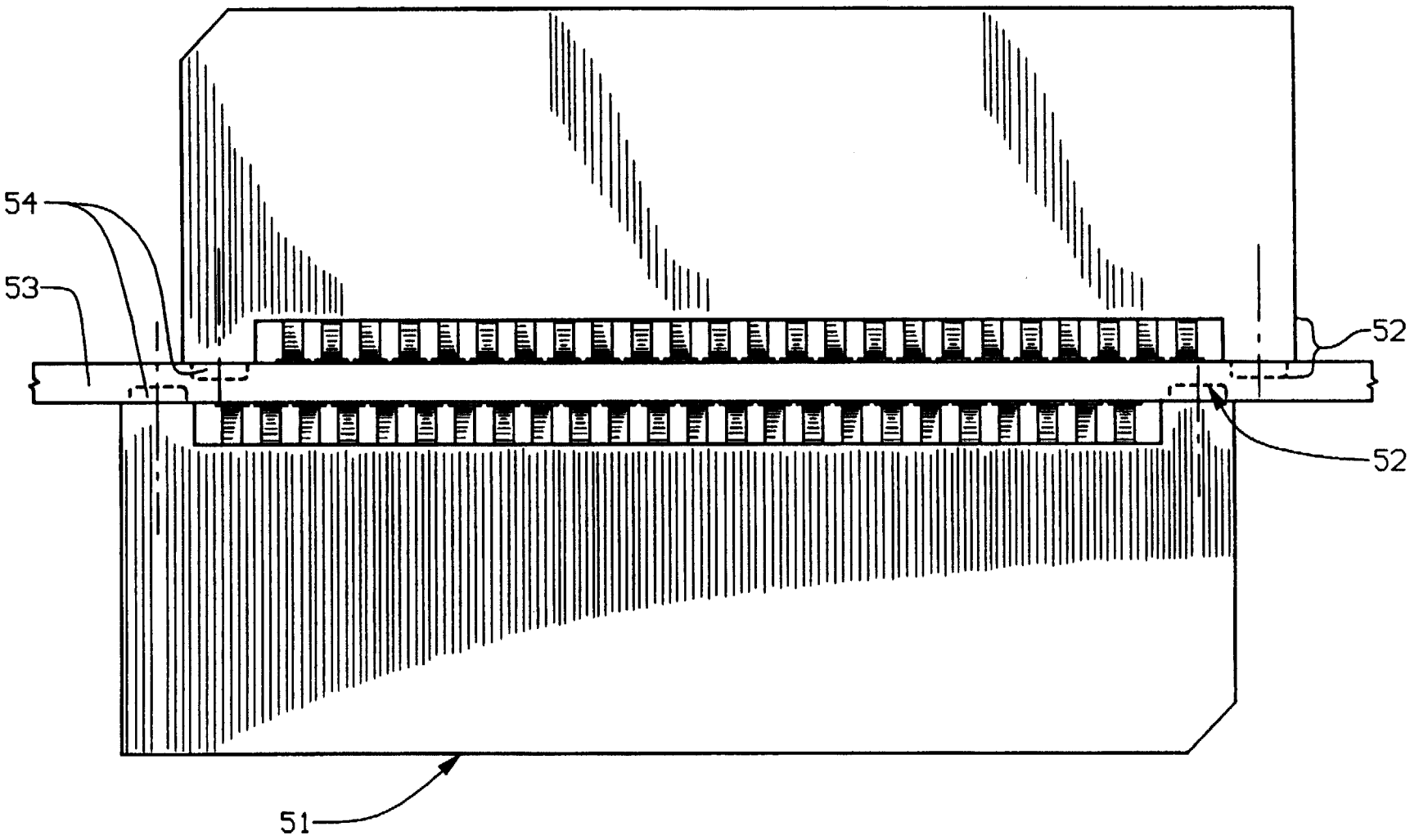
FIG. 5 is a partial longitudinal side elevational view of a pair of second embodiments of the new gull-wing ZIP package having anchoring pins, said packages adhesively secured to opposite sides of a printed circuit board.

Referring now to FIG. 5, a pair *of* identical second-embodiment gull-wing ZIP packages 51 are shown bonded to opposite sides of a printed circuit board. It will be noted that, in this case, anchoring pins 52 do not extend from one side of circuit board 53 to the other. Anchoring pins 52 of this particular embodiment have rectangular-cross-section shanks 53. Quick-setting cyano-acrylic adhesive is utilized to bond the cylindrical nubs 54 of anchoring pins 52 in the depressions 55 on board 53. *In this embodiment, depressions 55 serve merely as alignment recesses, being incapable of providing vertical support to the packages 51 and maintain the leads 18 in a state of compression against the board bonding pads 19 without the use of an adhesive to anchor the nubs 54 within the depressions 55.* The advantage to this approach is that two different molds are not required to provide components to stuff both sides of a circuit board.

Figure 6:
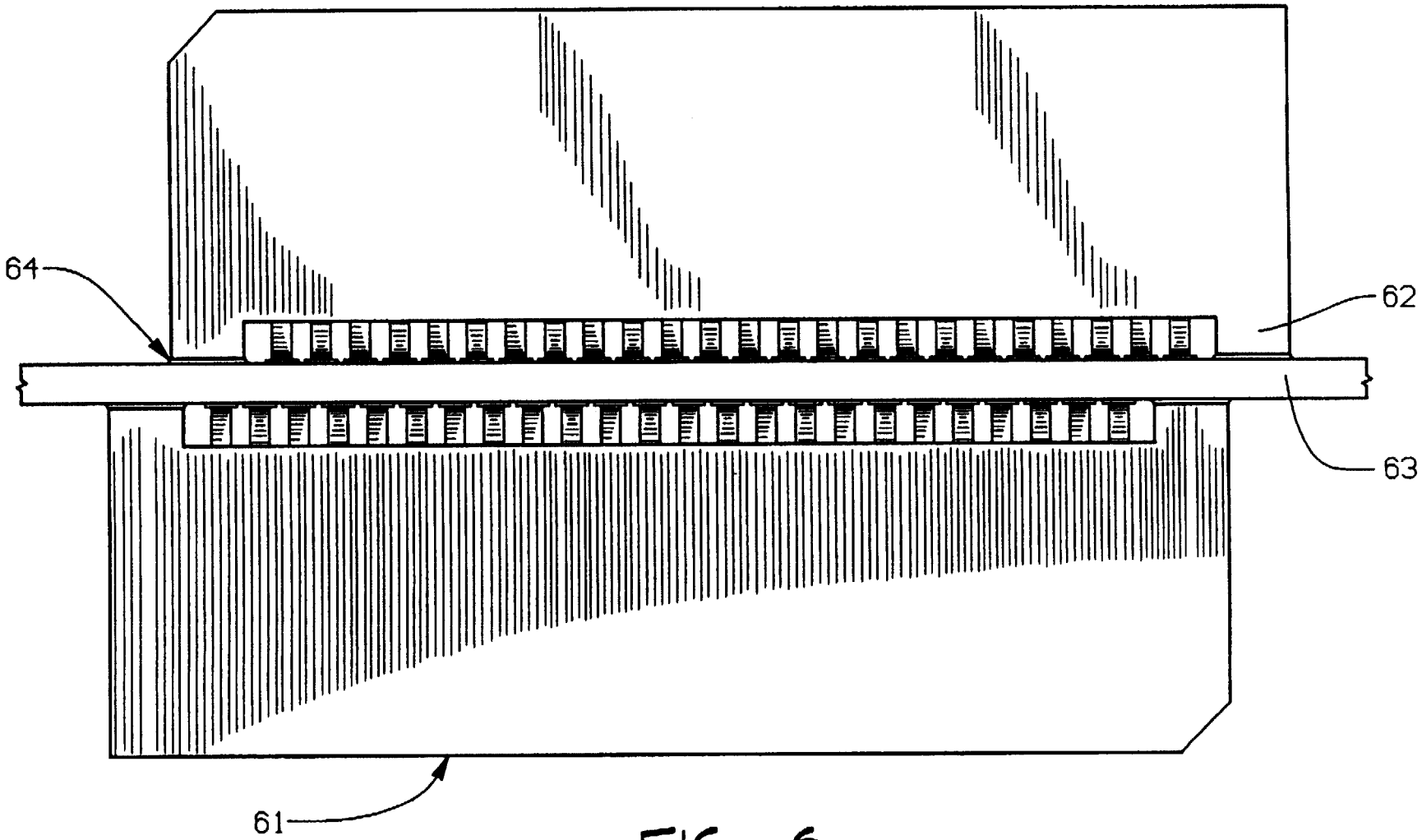
FIG. 6 is a partial longitudinal side elevational view of a pair of third embodiments of the new gull-wing ZIP package adhesively secured to opposite sides of a printed circuit board.

Referring now to FIG. 6, a pair of identical third-embodiment gull-wing ZIP packages 61 are shown anchored to opposite sides of a common printed circuit board 63. This embodiment does not require the drilling of anchoring pin holes in the printed circuit board. The third embodiment ZIP package 61 is virtually identical to the second embodiment version depicted in FIG. 5, with the exception that the cylindrical nubs 54 of anchoring pins 52 have been eliminated completely. The end sections 62 of packages 61 have a planar surfaces which are bonded directly to circuit board 63 with quick-setting adhesive. Adhesive displaced during the bonding process is represented by fillet 64.

Figure 7:
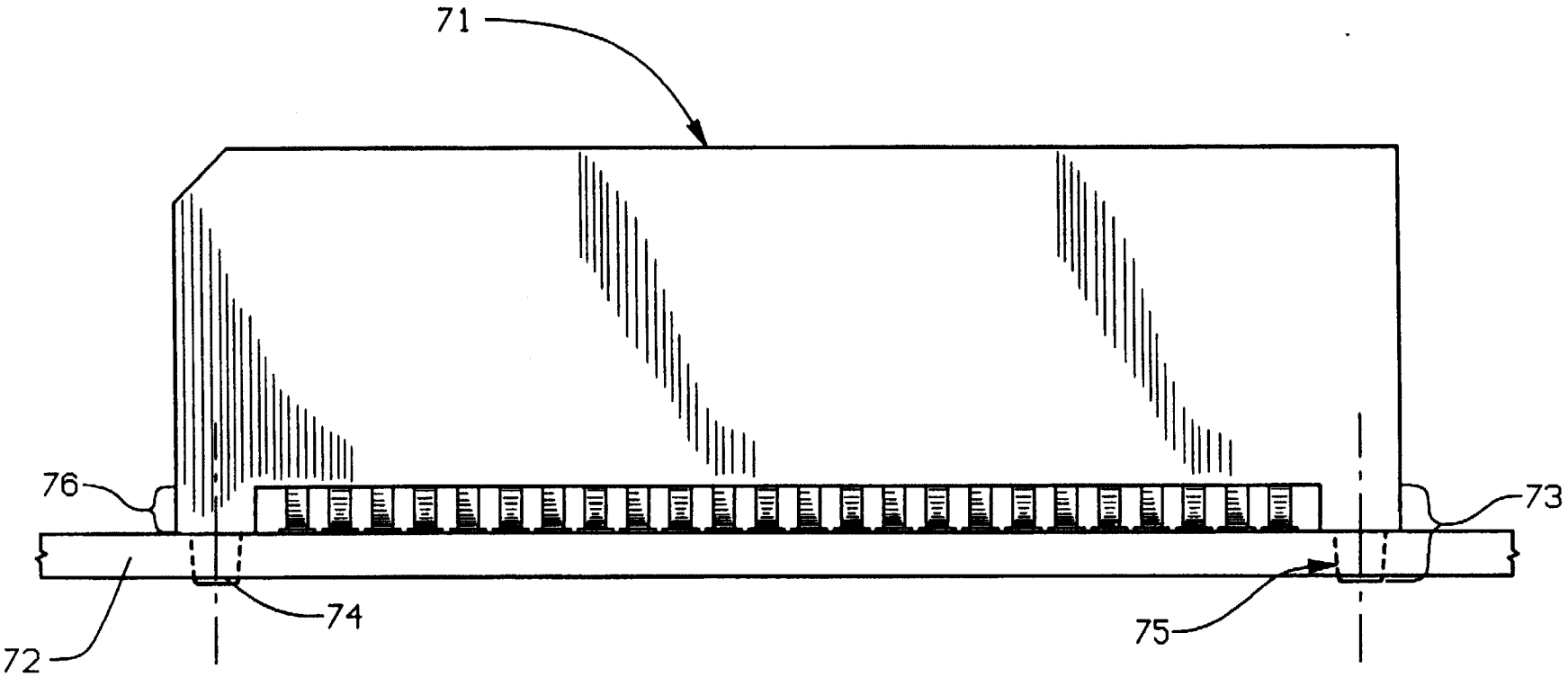
FIG. 7 is a longitudinal side elevational view of a pair of fourth embodiments of the new gull-wing ZIP package mounted on opposite sides of a printed circuit board said fourth embodiments having tapered anchoring pins for interference fit mounting.

Referring now to FIG. 7, a single fourth-embodiment gull-wing ZIP package 71 is shown mounted on a circuit board 72. The fourth embodiment ZIP package 71 is also virtually identical to the second embodiment version depicted in FIG. 5, with the exception that cylindrical nubs 54 of anchoring pins 52 have been replaced with tapered extensions 74. A pair of holes 75 have been drilled in circuit board 72. The holes are slightly larger in diameter than the tip of tapered extensions 74 to facilitate positioning of the package on the board with conventional automatic pick and place equipment. However, the hole diameter is smaller than the base of tapered extensions 74, such that when tapered extensions 74 are forced into the holes, friction will retain the gull-wing leads in a compressed state and the package itself in a stable upright position on circuit board 72 until a solder reflow can be effected. The rectangular-cross section shank 76 of anchoring pin 73 limits the insertion depth of tapered extensions 74 into circuit board 72.

Although only certain embodiments of the invention have been described herein, it will be apparent to one skilled in the art that changes and modifications may be made thereto without departing from the spirit and the scope of the invention as claimed.

I claim:

1. A vertically-oriented semiconductor package designed for surface mounting on one *of a* pair of planar surfaces of a printed circuit board, said package comprising:

a body having a pair of substantially parallel, vertical planar sides, lower and upper horizontal edges and a substantially vertical edge at each end of the package;

a semiconductor die having a face on which integrated circuitry is constructed, said die being encapsulated within said body such that said face is positioned between and substantially parallel to the vertical planar sides of said body;

a plurality of *gull-wing, zig-zag* inline leads, each of which is electrically connected, within said body, to a portion of the circuitry on said die, and each of which extends in a downward direction through the lower edge of said body, below which it is bent such that it is resiliently biased against the planar surface of the circuit board when the package is in a mounted position thereupon;

at least one downward-facing anchoring pin integral with said body at each end thereof; and means for securely attaching each anchoring pin to the circuit board in order to maintain a mounted position thereupon during solder reflow operations.

2. The semiconductor package of claim 1, wherein said means for securely attaching comprises a barb on the end of each anchoring pin which, when said anchoring pins are inserted from said one surface through properly sized and aligned holes in said circuit board, hooks on the other surface of said circuit board.

3. The semiconductor package of claim 2, wherein each of said anchoring pins has a shoulder that is larger than the diameter of the holes in said circuit board which seats against said one planar surface of said circuit board.

4. The semiconductor package of claim 3, wherein said anchoring pins are molded with an [outwardlyfacing] *outwardly-facing* bevel and with inwardly-facing barbs.

5. The semiconductor package of claim 3, wherein said anchoring pins are molded with an [inwardlyfacing] *inwardly-facing* bevel and with outwardly-facing barbs.

6. The semiconductor package of claim 1, wherein said means for securely attaching comprises a nub on the end of each anchoring pin which is anchored to a recess in said board with quick-setting adhesive.

7. The semiconductor package of claim 6, wherein each of said anchoring pins has a shoulder that is larger than the diameter of the recesses in said circuit board which seats against said one planar surface of said circuit board.

8. The semiconductor package of claim 1 wherein said means for securely attaching consists of bonding the end of each anchoring pin directly to the planar surface of said board with quick-setting adhesive.

9. The semiconductor package of claim 1, wherein said means for securely attaching comprises a tapered extension on the end of each anchoring pin which, when said anchoring pins are inserted from said one surface through holes in said circuit board that are properly aligned and properly sized for a forcedinsertion fit, said tapered extensions are frictionally locked in said holes.

10. The semiconductor package of claim 9, wherein each of said anchoring pins has a shoulder that is larger than the diameter of its corresponding hole in said circuit board, said shoulder seating against said one planar surface of said circuit board.

11. The semiconductor package of claim 10, wherein said tapered anchoring pin extensions are longer that the thickness of said circuit board.

12. A circuit board/semiconductor package assembly comprising a circuit board, a first gull-wing [ZIP] *zig-zag inline lead* semiconductor package having a pair of anchoring pins molded with an inwardly-facing bevel and with outwardly-facing barbs, and a second gull-wing [ZIP] *zig-zag inline lead* semiconductor package having a pair of anchoring pins molded with an outwardly-facing bevel and with inwardly-facing barbs, one anchoring pin of each of said first and second packages sharing a first anchoring hole in said board and the remaining pin of each of said first and second packages sharing a second anchoring hole in said board.

*13. A semiconductor package, designed for surface mounting on one of a pair of planar surfaces of a printed circuit board, said package comprising:*

*a body having a pair of substantially parallel, vertical planar faces, lower and upper horizontal edges, and a substantially vertical edge at both ends thereof;*

*a semiconductor die having a face on which integrated circuitry is constructed, said die being encapsulated within said body such that said face is positioned between and substantially parallel to the vertical planar faces of said body; and*

*a plurality of inline leads, each of which is electrically connected, within said body, to a portion of the circuitry on said die, and each of which extends in a downward direction through the lower edge of said body such that when said package is mounted on said circuit board, said leads are in compressive contact with said planar surface; and*

*at least one downward-facing anchoring pin integral with said body at each end thereof;*

*said anchoring pin having a barb on the end thereof which, when said anchoring pin is inserted from said one surface through properly sized and aligned holes in said circuit board, hooks on the other surface of said circuit board.*

*14. The semiconductor package of claim 13, wherein each said anchoring pin has a shoulder that is larger than the diameter of the holes in said circuit board which seats against said one planar surface of said circuit board.*

*15. The semiconductor package of claim 14, wherein said anchoring pins are molded with an outwardly-facing bevel and with inwardly-facing barbs.*

*16. The semiconductor package of claim 14, wherein said anchoring pins are molded with an inwardly-facing bevel and with outwardly-facing barbs.*

*17. A semiconductor package, designed for surface mounting on one of a pair of planar surfaces of a printed circuit board, said package comprising:*

*a body having a pair of substantially parallel, vertical planar faces, lower and upper horizontal edges, and a substantially vertical edge at both ends thereof;*

*a semiconductor die having a face on which integrated circuitry is constructed, said die being encapsulated within said body such that said face is positioned between and substantially parallel to the vertical planar faces of said body; and*

*a plurality of inline leads, each of which is electrically connected, within said body, to a portion of the circuitry on said die, and each of which extends in a downward direction through the lower edge of said body such that when said package is mounted on said circuit board, said leads are in compressive contact with said planar surface; and*

*at least one downward-facing anchoring pin integral with said body at each end thereof;*

*said anchoring pin having a nub on the end thereof which is non-frictionally anchored within an alignment recess in said board with quick-setting adhesive.*

*18. A semiconductor package, designed for surface mounting on one of a pair of planar surfaces of a printed circuit board, said package comprising:*

*a body having a pair of substantially parallel, vertical planar faces, lower and upper horizontal edges, and a substantially vertical edge at both ends thereof;*

*a semiconductor die having a face on which integrated circuitry is constructed, said die being encapsulated within said body such that said face is positioned*

*between and substantially parallel to the vertical planar faces of said body; and*

*a plurality of inline leads, each of which is electrically connected, within said body, to a portion of the circuitry on said die, and each of which extends in a downward direction through the lower edge of said body such that when said package is mounted on said circuit board, said leads are in compressive contact with said planar surface; and*

*at least one downward-facing anchoring pin integral with said body at each end thereof;*

*the end of said anchoring pin having a planar surface which is bondable directly to the planar surface of said board with quick-setting adhesive.*

* * * * *